(12) United States Patent
Lin et al.

(10) Patent No.: US 7,016,450 B2
(45) Date of Patent: Mar. 21, 2006

(54) CLOCK RECOVERY CIRCUIT AND RELATED METHODS

(75) Inventors: Jyh-Fong Lin, Taipei (TW); Hsin-Chieh Lin, Taipei (TW); Yi-Bin Hsieh, Taipei Hsien (TW)

(73) Assignee: VIA Technologies Inc., Taipei Hsien (TW)

( * ) Notice: Subject to any disclaimer, the term of this patent is extended or adjusted under 35 U.S.C. 154(b) by 733 days.

(21) Appl. No.: 10/064,215

(22) Filed: Jun. 21, 2002

(65) Prior Publication Data

US 2003/0057928 A1    Mar. 27, 2003

(30) Foreign Application Priority Data

Sep. 12, 2001  (TW) .............................. 90122671 A (51) Int. Cl.
*H03D 3/24*    (2006.01)

(52) U.S. Cl. ...................... 375/374; 375/375; 327/148

(58) Field of Classification Search ................ 375/371, 375/373, 374, 375, 376, 226, 229, 232, 233, 375/236, 355, 359; 329/346, 358, 3, 360; 455/3.04, 255, 262, 265; 327/141, 143, 147, 327/148, 156, 157, 164, 165
See application file for complete search history.

(56) References Cited

U.S. PATENT DOCUMENTS

| | | | | |
|---|---|---|---|---|
| 5,047,733 A | * | 9/1991 | Nonaka et al. | 331/14 |
| 5,389,899 A | * | 2/1995 | Yahagi et al. | 331/10 |
| 5,497,128 A | * | 3/1996 | Sasaki | 331/38 |
| 5,548,249 A | * | 8/1996 | Sumita et al. | 331/1 A |
| 5,847,614 A | * | 12/1998 | Gilbert et al. | 331/14 |
| 5,950,115 A | * | 9/1999 | Momtaz et al. | 455/73 |
| 6,057,739 A | * | 5/2000 | Crowley et al. | 331/14 |

OTHER PUBLICATIONS

Wang Ruo-Peng, L I Shu-Guang, Zheng Zeng-Yu; A Clock and Data Recovery Circuit for 10-Mb/s and 100-Mb/s Ethernet; Microelectronics; Aug. 2002; p. 308-p. 311; vol. 32 No. 4.

* cited by examiner

*Primary Examiner*—Tesfaldet Bocure
*Assistant Examiner*—Naheed Ejaz
(74) *Attorney, Agent, or Firm*—Winston Hsu (57) ABSTRACT

A clock recovery circuit for generating an output signal that is synchronized with an input signal. The clock recovery circuit includes a charge pump, a first filter, an oscillator, a switch circuit, and a second filter. When the charge pump operates, the switch circuit will disconnect the first filter from the oscillator. Additionally, when the charge pump stops operating, the switch circuit will connect the first filter and the oscillator such that the oscillator adjusts a frequency or phase of the output signal according to the output voltage of the first filter.

4 Claims, 6 Drawing Sheets

CLOCK RECOVERY CIRCUIT AND RELATED METHODS

BACKGROUND OF INVENTION

1. Field of the Invention

The present invention relates to a clock and data recovery circuit and related methods, and more specifically, the present invention discloses a clock and data recovery circuit and related methods capable of preventing transmitting signals from jittering.

2. Description of the Prior Art

In modern society, transmission and operation of a great deal of electronic data have improved human life, and information and knowledge with rapid exchanging speed have increased development of science and technology. In general, when transmitting or operating electronic data, a predetermined clock must be provided for accurately analyzing data contents of the electronic data and successfully processing operation of the electronic data.

Figure 1:
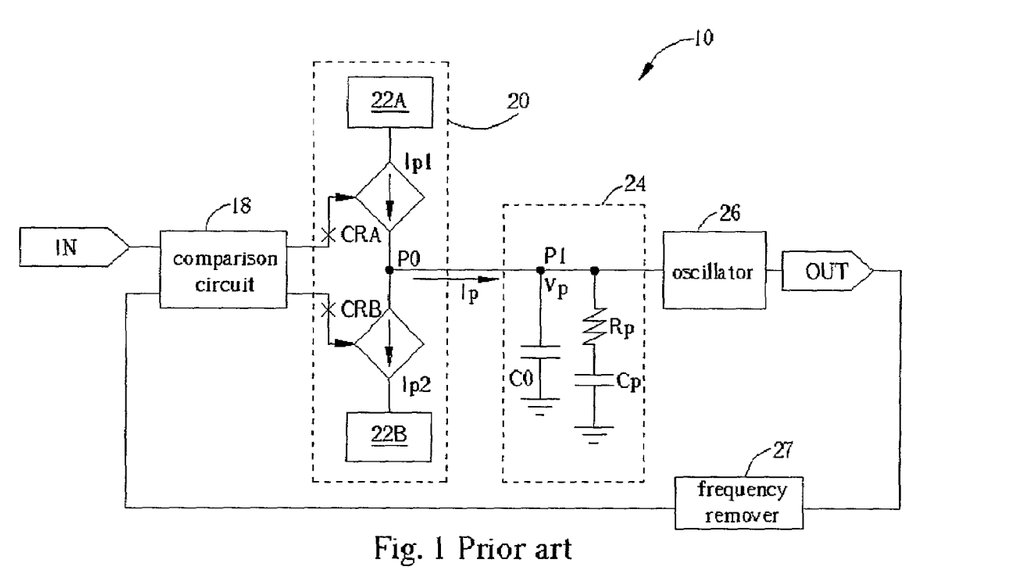
FIG. 1 is a block diagram of a data recovery circuit according to the prior art.

To get corresponding clocks from input data for recovering data, a data recovery circuit is used. Please refer to FIG. 1. FIG. 1 is a block diagram of a data recovery circuit 10 according to the prior art. The data recovery circuit 10 can generate an output signal OUT that is synchronized with an input signal IN. The data recovery circuit 10 comprises a comparison circuit 18, a charge pump 20, a filter 24, a voltage control oscillator 26, and a 1/N frequency remover 27. The charge pump 20 comprises two bias circuits 22A and 22B, and two current sources Ip1 and Ip2. The bias circuits 22A and 22B are used to respectively supply working biases to allow the current sources Ip1 and Ip2 to operate normally. The current sources Ip1 and Ip2 are respectively controlled by two control signals CRA and CRB generated from the comparison circuit 18. After an addition effect, the current sources Ip1 and Ip2 generate a charge current Ip at a node P0 and transmit the charge current Ip to the filter 24. The filter 24 is a low-pass filter formed by a resistor Rp and two capacitors Cp and C0. After the charge current Ip generated from the charge pump 20 flows into the filter 24, the capacitor Cp will be charged and forms a control voltage Vp at a node P1. The oscillator 26 will be controlled by the control voltage Vp and generate an output signal OUT, which has a frequency corresponding to the control voltage Vp. That is, magnitude of the frequency of the output signal OUT generated from the oscillator 26 will be proportional to magnitude of the control voltage Vp (generally speaking, when the control voltage Vp is greater, the frequency of the control voltage Vp becomes higher). The output signal OUT will be transmitted to the frequency remover 27 to remove the frequency of the output signal OUT, and then feedback to the comparison circuit 18. Finally, the comparison circuit 18 will compare a phase difference between the input signal IN and the output signal OUT, and control the current sources Ip1 and Ip2 of the charge pump 20 according to the phase difference.

After being controlled by the comparison circuit 18, the charge pump 20 generates the corresponding charge current Ip, and the charge current Ip will correspondingly change the control voltage Vp of the filter 24 and further control the oscillator 26 to adjust the frequency and phase of the output signal OUT so as to allow the output signal OUT to be synchronized with the input signal IN. Finally, the output signal OUT has the same phase as the input signal IN through the adjustment of the frequency and phase of the output signal OUT by the data recovery circuit 10.

Figure 2:
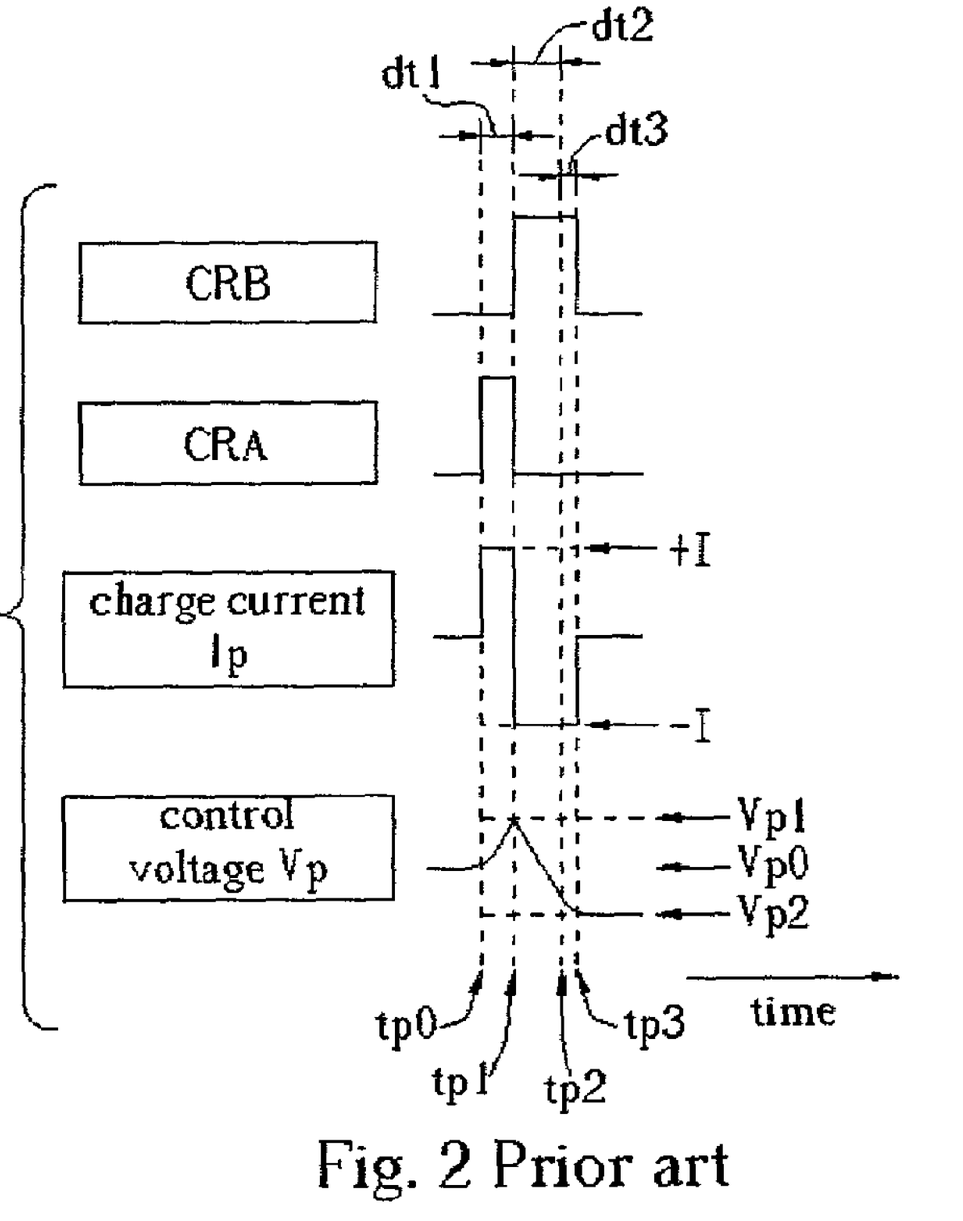
FIG. 2 shows oscillograms of related signals of the data recovery circuit when the data recovery circuit operates according to the prior art.

Please refer to FIG. 2. FIG. 2 shows oscillograms of related signals of the data recovery circuit 10 when the data recovery circuit 10 operates according to the prior art. As shown in FIG. 2, a horizontal axis indicates time, and a vertical axis of each waveform indicates magnitude of amplitude. For example, the control signal CRA is at a high level during a time interval dt1, and the control signal CRB is at a high level during a time level dt2+dt3. To enable the oscillator 26 to adjust the output signal OUT so as to compensate the above periodic errors, the control voltage Vp must be changed corresponding to the periodic errors. That is, the control voltage Vp is changeable for reacting to the phase difference between the input signal IN and the output signal OUT so as to allow the oscillator 26 to adjust the frequency and phase of the output signal OUT according to a changing situation of the control voltage Vp.

To achieve the aforementioned objective, operation of the data recovery circuit 10 can be illustrated as follows. When the data recovery circuit 10 operates, the control signals CRB and CRA are used to control current of the current sources Ip1 and Ip2. That is, when the control signal CRB or CRA is high, the corresponding current source Ip1 or Ip2 is switched on and supplies a certain current I; when the control signal CRB or CRA is low, the corresponding current source Ip1 or Ip2 is switched off and does not supply current. Therefore, during a time interval between tp0 and tp1, magnitude of the charge current Ip supplied by the current source Ip1 is I such that the charge current Ip will cause the control voltage Vp of the filter 24 to increase from a voltage Vp0 to a voltage Vp1. Since the time interval between tp0 and tp1 is dt1, an increasing range of the control voltage Vp will be proportional to the time interval dt1. During a time interval between tp2 and tp3, the control signal CRB causes the current source Ip2 to control the charge current Ip so as to allow the charge current Ip to discharge to the capacitors C0 and Cp, and to decrease magnitude of the control voltage Vp from Vp1 to Vp2. In general, during a time interval between tp0 and tp3, the control voltage Vp firstly increases from Vp0 to Vp1, and then decreases from Vp1 to Vp2. Therefore, a difference between the Vp0 and Vp2 of the control voltage Vp will respond to a phase difference between the input signal IN and the output signal OUT. Furthermore, the oscillator 26 can adjust the frequency and phase of the output signal OUT according to change of the control voltage Vp.

A defect of operating manner of the data recovery circuit 10 is to cause the phase difference of the control voltage Vp to have a large jitter. As mentioned above, the control voltage Vp is used to show the phase difference between the input signal IN and the output signal OUT. Since the voltage change between the voltage Vp0 and the voltage Vp2 responds to the phase difference, the way to show the phase difference is simply to change the control voltage Vp from the voltage Vp0 to the voltage Vp2. In the data recovery circuit 10, the control voltage Vp first increases from Vp0 to Vp1, and then decreases from Vp1 to Vp2. Therefore, this will cause the output signal OUT to jitter.

Figure 3:
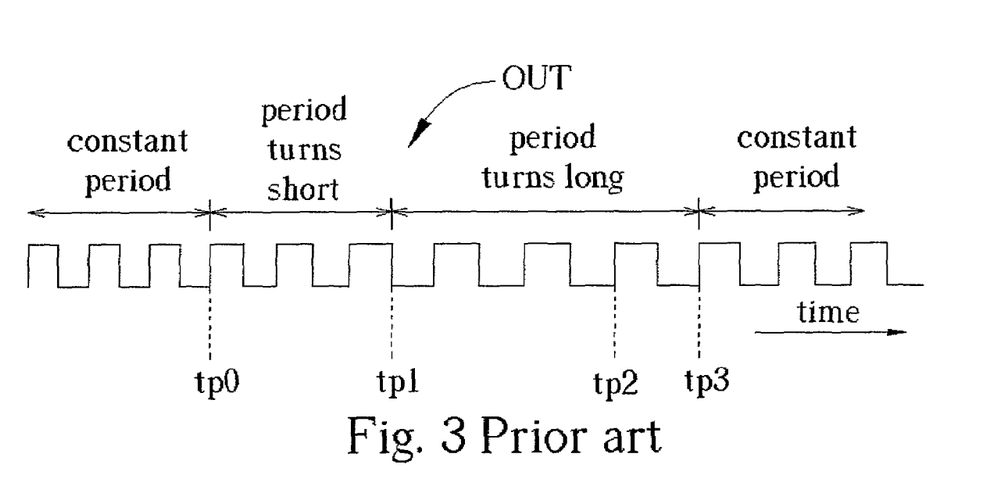
FIG. 3 shows an oscillogram of an output signal generated from the prior data recovery circuit when the output signal is jittered.

Please refer to FIG. 3. FIG. 3 shows an oscillogram of the output signal OUT generated from the prior data recovery circuit 10 when the output signal OUT is jittered. As shown in FIG. 3, a horizontal axis indicates time, and a vertical axis indicates magnitude of waveform. Since the oscillator 26 is controlled by the control voltage Vp, variance of the control voltage Vp will influence the output signal OUT generated from the oscillator 26. Transient states of the variance of the control voltage Vp will cause the frequency of the output signal OUT to float so that the output signal OUT will have periods with irregular variance. When the period of the output signal OUT is changed from tp0 to tp3, that is, the voltage of the control voltage Vp is changed from Vp0 to Vp2, the frequency of the output signal OUT will turn high or low due to the transient variance of the control voltage Vp. This is called the signal jitter. The signal jitter with frequency of irregular variance will be accumulated and interfere with the period of the output signal OUT so that the output signal OUT cannot be correctly synchronized with the input signal IN. Since the signal jitter generated from the output signal OUT is a high-frequency signal jitter, the high-frequency signal jitter is difficult to compensate through a feedback method of the data recovery circuit 10 itself. The filter 24 of the data recovery circuit 10 has a low-pass characteristic to filter out period errors of the high-frequency signal jitter caused between the input signal IN and the output signal OUT. This situation will cause the data recovery circuit 10 to have hardly compensating the high-frequency signal jitter, and cause the output signal OUT to spend more time synchronizing with the input signal IN.

SUMMARY OF INVENTION

It is therefore a primary objective of the claimed invention to provide a data recovery circuit and related methods for restraining transient variance in a control voltage so as to eliminate unwanted transient phenomena in the control voltage.

The claimed invention, briefly summarized, discloses a data recovery circuit for generating an output signal that is synchronized with an input signal. The data recovery circuit includes a charge pump, a first filter, an oscillator, a switch circuit, and a second filter. When the charge pump operates, the switch circuit will disconnect the first filter from the oscillator. Additionally, when the charge pump stops operating, the switch circuit will connect the first filter and the oscillator such that the oscillator adjusts a frequency or phase of the output signal according to the output voltage of the first filter.

It is an advantage of the claimed invention that the claimed data recovery circuit can utilize a switch circuit to reduce transient states of the control voltage so as to reduce or eliminate signal jitter of the output signal, and to further maintain accuracy of the clock and data recovery.

These and other objectives and advantages of the claimed invention will no doubt become obvious to those of ordinary skill in the art after reading the following detailed description of the preferred embodiment that is illustrated in the various figures and drawings.

DETAILED DESCRIPTION

Figure 4:
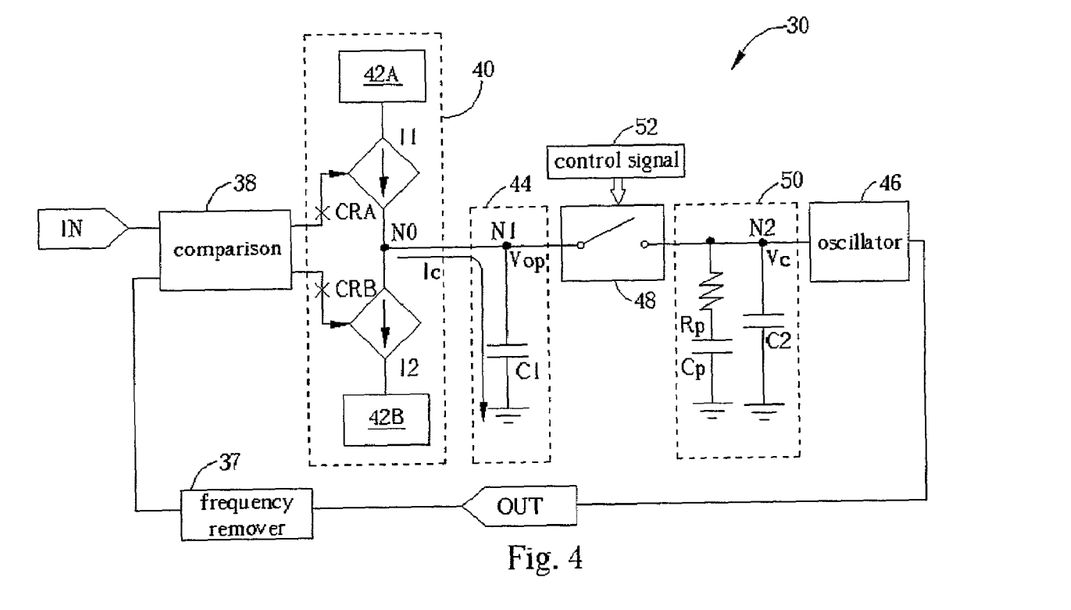
FIG. 4 is a block diagram of a data recovery circuit according to the present invention.

Please refer to FIG. 4. FIG. 4 is a block diagram of a data recovery circuit 30 according to the present invention. The present data recovery circuit 30 generates a corresponding clock, which means an output signal OUT, according to an input signal IN. As shown in FIG. 4, the data recovery circuit 30 comprises a comparison circuit 38, a charge pump 40, a first filter 44, a switch circuit 48, a second filter 50, an oscillator 56, and a 1/N frequency remover 37. The charge pump 40 comprises two bias circuits 42A and 42B, and two current sources I1 and I2. The bias circuits 42A and 42B are used to respectively supply working biases to allow the current sources I1 and I2 to operate normally. The current sources I1 and I2 are respectively controlled by two control signals CRA and CRB generated from the comparison circuit 38. After an addition effect, the current sources I1 and I2 generate a charge current Ic at a node and transmit the charge current Ic to the first filter 44. The first filter 44 is a low-pass filter formed by a first capacitor C1. After the charge current Ic generated from the charge pump 40 flows into the first filter 44, the first filter 44 will generate an output voltage Vop at a node N1. A control signal 52 controls on/off of the switch circuit 48 and further controls electric connection between the first filter 44 and the second filter 50. The second filter 50 comprises a second capacitor C2, a capacitor Cp, and a resistor Rp. The second filter 50 can generate a control voltage Vc at a node N2 for controlling the oscillator 46.

The oscillator 46 will be controlled by the control voltage Vc and generate an output signal OUT, which has a frequency corresponding to the control voltage Vc. The output signal OUT will be transmitted to the frequency remover 37 to remove the frequency of the output signal OUT, and then feedback to the comparison circuit 38. Finally, the comparison circuit 38 will compare a phase difference between the input signal IN and the output signal OUT, and control the current sources I1 and I2 of the charge pump 40 according to the phase difference. The charge current Ic formed by the current sources I1 and I2 will generate the output voltage Vop of the first filter at the node N1. When the switch circuit 48 electrically connects the second filter 50 with the first filter 44 in an appropriate time, the output voltage Vop generated from the first filter 44 will be adjusted to a corresponding control voltage Vc via charge sharing of the second filter 50. The control voltage Vc controls the oscillator 46 and adjusts the phase of the output signal OUT generated from the oscillator 46 so as to synchronize with the input signal IN.

Figure 5:
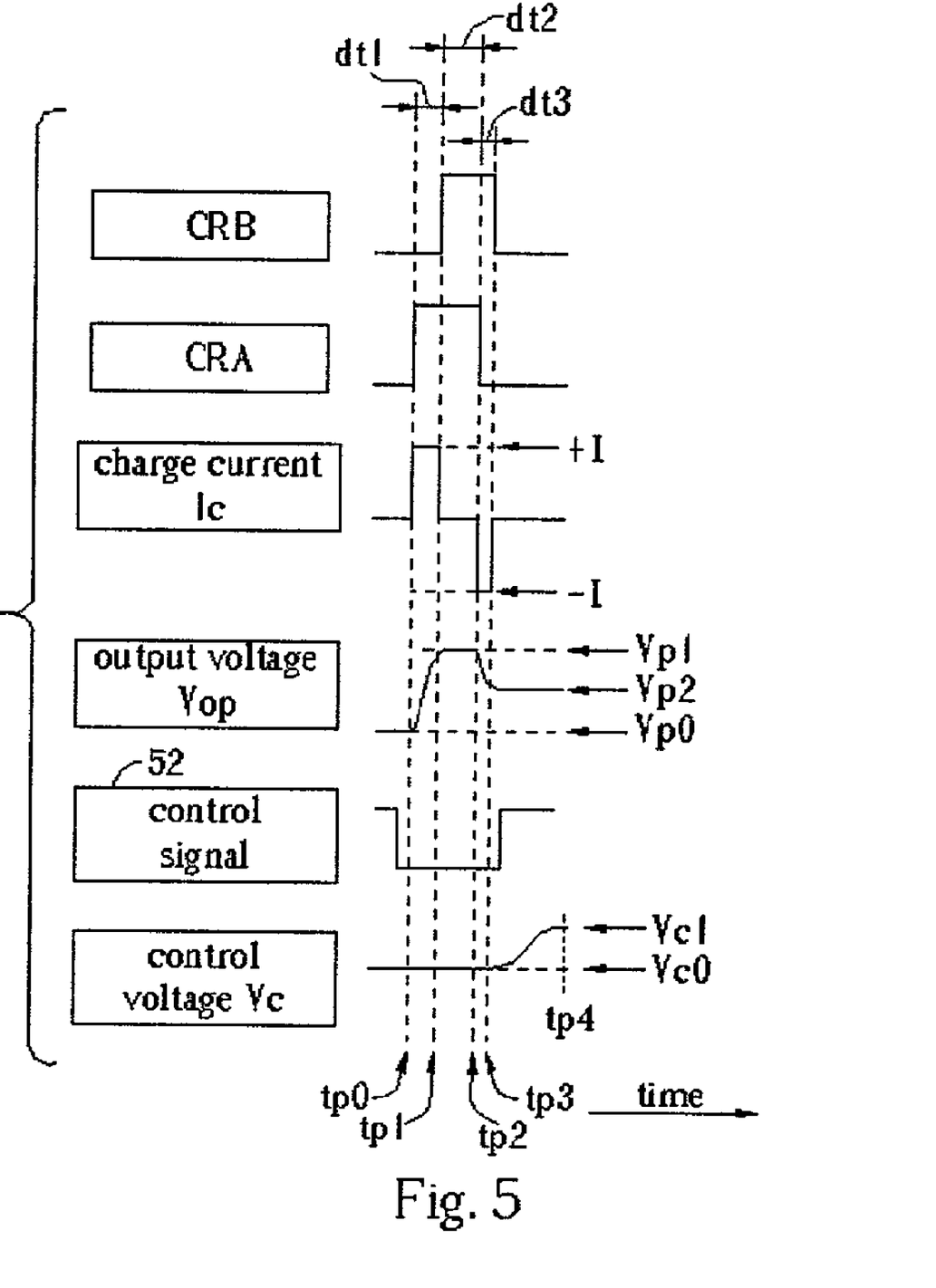
FIG. 5 shows oscillograms of related signals of the data recovery circuit when the data recovery circuit operates according to the present invention.

The present data recovery circuit 30 also shows the phase difference between the input signal IN and the output signal OUT in the control voltage Vc so as to allow the oscillator 46 to adjust frequency of the output signal OUT according to the control voltage Vc. Please refer to FIG. 5. FIG. 5 shows oscillograms of related signals of the data recovery circuit 30 when the data recovery circuit 30 operates according to the present invention. As shown in FIG. 5, a horizontal axis indicates time, and a vertical axis of each waveform indicates magnitude of amplitude. In FIG. 5, the waveforms listed from top to bottom are control signal CRB, control signal CRA, charge current Ic, control signal 52, output voltage Vop, and control voltage Vc respectively. The comparison circuit 38 of the present data recovery circuit 30 also utilizes the same mode as the prior comparison circuit 18 to control the current sources I1 and I2. That is, when the control signal CRA is high, the control source I1 supplies a constant current I. Oppositely, when the control signal CRA is low, the control source I1 supplies no current. Similarly, the control signal CRB also uses the same mode to control the current source I2. When the control signal 52 is high, the switch circuit 48 will be switched on so as to allow the first filter 44 to be electrically connected with the second filter 50. Oppositely, when the control signal 52 is low, the switch circuit 48 will be opened and switched off so that the first filter 44 cannot be electrically connected with the second filter 50.

To show the phase difference between the output signal OUT and the input signal IN, the control voltage Vc must have a corresponding voltage change. Since the charge current Ic is changed in accordance with the waveform differences between the control signals CRA and CRB during a time interval between tp0 and tp3, the output voltage Vop, which is the same as the prior control voltage Vp, will first increase from Vp0 to Vp1, and then decrease from Vp1 to Vp2. Although the voltage change between the Vp0 and Vp2 responds to a phase difference between the input signal IN and the output signal OUT, the output voltage Vop will exist an unwanted transient state just like the prior control voltage Vp. In order to prevent the transient state from influencing the output signal OUT generated from the oscillator 46 and causing signal jitter, the present invention utilizes the switch circuit 48 to appropriately separate the transient state of the output voltage Vop of the first filter 44. When the output voltage Vop of the first filter 44 stays in the transient state, which is in a time interval between tp0 and tp3, the control signal 52 will stay low so that the switch circuit 48 will be opened and switched off. Therefore, the first filter 44 cannot be electrically connected to the second filter 50, and the control voltage Vc at the node N2 of the second filter 50 does not permit the transient change accompanying the output voltage Vop.

After passing time tp3, the control signal 52 turns high. At this time, the switch circuit 48 is switched on, and the second filter 50 is electrically connected to the first filter 44. The second capacitor C2 in the second filter 50 will be charged by the switch circuit 48 according to the output voltage Vop of the first filter 44, and further changes the control voltage Vc at the node N2. In the waveform of the control voltage Vc shown in FIG. 5, during the time interval between tp0 and tp3, the control signal 52 stays low, and the second filter 50 cannot be electrically connected with the first filter 44 so that the control voltage Vc of the second filter 50 cannot be changed. The control signal 52 turns high after passing time tp3, the second filter 50 electrically connects with the first filter 44 via the switch circuit 48, and the control voltage Vc can also be changed to Vc1 smoothly from a preceding voltage Vc0. After passing time tp4, the control voltage Vc will be constant. The voltage Vc0 corresponds with the voltage Vp0 of the output voltage Vop, which is related to capacitances of the first capacitor C1 and the second capacitor C2. For example, the voltage Vp0 is double of the voltage Vc0. Similarly, the voltage Vc1 also corresponds with the voltage Vp1 using the same corresponding relationship. Thus, the output voltage Vop is proportional to the phase difference, and the voltage difference between the voltage Vc0 and the voltage Vc1 is also proportional to the phase difference due to the constant and corresponding relationship between the output voltage Vop and the control voltage Vc. Therefore, the oscillator 46 can exactly and effectively adjust the output signal OUT so as to synchronize with the input signal IN, according to the variance of the control voltage Vc.

In the above-mentioned description, although the output voltage Vop of the first filter 44 contains the same transient state as the prior art, the control voltage Vc for controlling the oscillator 46 cannot be influenced by the transient state of the output voltage Vop due to the appropriate separation of the switch circuit 48. After the output voltage Vop has been restored stability, the control voltage Vc will be changed in accordance with the output voltage Vop. Therefore, the present invention cannot only allow the oscillator 46 to exactly adjust the frequency of the output signal OUT according to the control voltage Vc, but also reduce the signal jitter of the output signal OUT caused by the transient state of the control voltage Vc.

Figure 6:
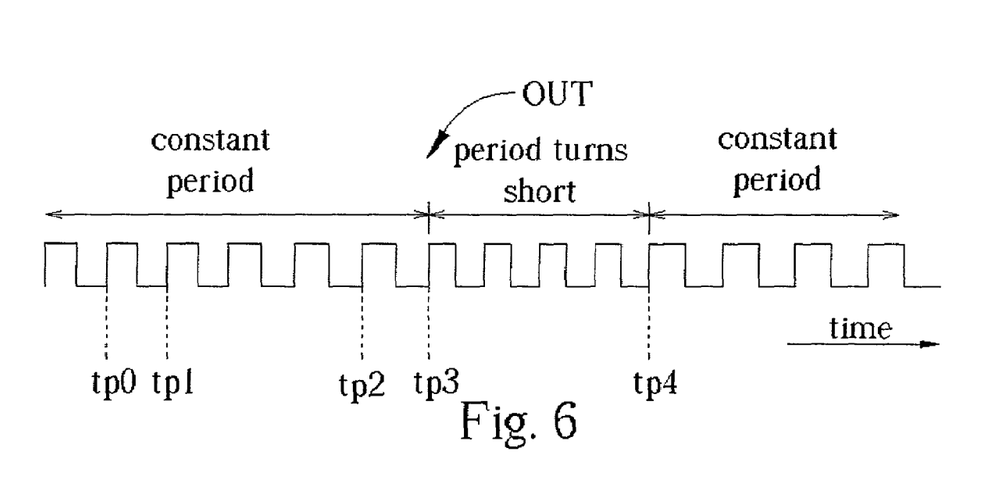
FIG. 6 shows an oscillogram of an output signal generated from the present data recovery circuit.

Please refer to FIG. 6. FIG. 6 shows an oscillogram of an output signal OUT generated from the present data recovery circuit 30. As shown in FIG. 6, when the period of the output signal OUT is changed from tp0 to tp4, that is, the control voltage Vc is changed from Vc0 to Vc1, the frequency of the output signal OUT cannot contain unstable jitters due to the smooth variance of the control voltage Vc. Furthermore, the control signals CRA and CRB overlap each other when the switch circuit 48 is switched on so as to obtain a better effect for the present invention.

In contrast to the prior art, the present data recovery circuit utilizes a switch circuit to reduce transient states of the control voltage so as to reduce or eliminate signal jitter of the output signal, and further to maintain accuracy of the clock and data recovery. It is noteworthy that the above discussion is only related to a comparison circuit in cooperation with a charge pump under a specific control mode, but the claimed data recovery circuit is suitable for any charge pumps with different control modes to eliminate the prior art transient state of the charge pump when generating a related control voltage.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A clock recovery circuit for generating an output signal that is synchronized with an input signal; the clock recovery circuit comprising:
    a charge pump for generating a charging current according to a phase difference between the input signal and the output signal;
    a first filter electrically connected to the charge pump for generating an output voltage corresponding to the charging current;
    a second filter for adjusting the output voltage of the first filter;
    a switch circuit electrically connected in series between the first filter and the second filter for controlling the electrical connection between the first filter and the second filter; and
    an oscillator for adjusting a phase or frequency of the output signal according to a voltage;
    wherein when the charge pump is operating, the switch circuit disconnects the first filter from the oscillator, and when the charge pump stops operating, the switch circuit connects the first filter and the oscillator such that the oscillator adjusts the frequency or phase of the output signal according to the output voltage of the first filter.

2. The clock recovery circuit of claim 1 wherein the second filter comprises at least a second capacitor; when the switch circuit connects the first filter and the second filter, the second capacitor is charged or discharged by the output voltage of the first filter so as to change a waveform of the output voltage.

3. The clock recovery circuit of claim 2 wherein the first filter comprises at least a first capacitor, and the charging current charges or discharges the first capacitor for changing the output voltage of the first filter.

4. A clock recovery method for generating an output signal that is synchronized with an input signal; the method comprising:

generating a charging current according to a phase difference between the input signal and the output signal;

generating an output voltage according to the charging current with a first filter;

adjusting the output voltage of the first filter with a second filter;

connecting a switch in series between the first filter and the second filter; and closing the switch for adjusting a frequency or phase of the output signal only after a waveform of the output voltage has been stable.

* * * * *